United States Patent
Lee et al.

(10) Patent No.: US 7,808,494 B2
(45) Date of Patent: Oct. 5, 2010

(54) DISPLAY DEVICE AND DRIVING METHOD THEREOF

(75) Inventors: Yong-Soon Lee, Gyeonggi-do (KR);
Po-Yun Park, Gyeonggi-do (KR);
Nam-Soo Kang, Gyeonggi-do (KR);
Haeng-Won Park, Gyeonggi-do (KR);
Seung-Hwan Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 946 days.

(21) Appl. No.: 11/241,211

(22) Filed: Sep. 30, 2005

(65) Prior Publication Data

US 2006/0081850 A1   Apr. 20, 2006

(30) Foreign Application Priority Data

Oct. 1, 2004   (KR)   ...................... 10-2004-0078279

(51) Int. Cl.
*G09G 5/00* (2006.01)
(52) U.S. Cl. .................... 345/206; 345/87; 345/92; 345/100; 345/103; 345/204; 345/205; 345/208; 345/690; 345/695; 345/98; 349/54; 349/143
(58) Field of Classification Search .............. 345/36, 345/38, 40, 43–46, 50–52, 55, 87, 92–100, 345/103, 204, 690–695, 208, 89; 257/72; 349/54
See application file for complete search history.

(56) References Cited

U.S. PATENT DOCUMENTS

| 4,781,438 | A | * | 11/1988 | Noguchi | ...................... | 349/54 |
|---|---|---|---|---|---|---|
| 5,151,689 | A | * | 9/1992 | Kabuto et al. | ................ | 345/103 |
| 6,552,707 | B1 | * | 4/2003 | Fujiyoshi | ...................... | 345/98 |
| 6,707,441 | B1 | * | 3/2004 | Hebiguchi et al. | ............. | 345/92 |
| 6,891,522 | B2 | * | 5/2005 | Song et al. | .................... | 345/87 |
| 2003/0189559 | A1 | * | 10/2003 | Lee et al. | ..................... | 345/204 |

FOREIGN PATENT DOCUMENTS

| CN | 1371088 A | 9/2002 |
|---|---|---|
| CN | 1396581 A | 2/2003 |
| JP | 2003-215538 A | 7/2003 |
| JP | 2003-345314 A | 12/2003 |
| JP | 2004-029477 A | 1/2004 |

* cited by examiner

*Primary Examiner*—Richard Hjerpe
*Assistant Examiner*—Saifeldin Elnafia
(74) *Attorney, Agent, or Firm*—Innovation Counsel LLP

(57) ABSTRACT

A display device that employs fewer IC chips and lends itself to cost-efficient manufacturing is presented. The device includes: a plurality of pixel rows including first and second pixels alternately arranged; a plurality of first and second gate lines disposed above and below the pixel rows and applying first and second gate-on voltages to the first and the second pixels, respectively; data lines intersecting the first and the second gate lines, each data line disposed between the first and the second pixels in a pair of first and second pixels and applying data voltages to the first and the second pixels; first and second gate drivers applying the first and the second gate-on voltages to the first and the second gate lines; and a data driver applying the data voltages to the data lines, wherein the second gate-on voltage is applied earlier than the first gate-on voltages by a predetermined time.

18 Claims, 10 Drawing Sheets

DISPLAY DEVICE AND DRIVING METHOD THEREOF

CROSS-REFERENCE TO RELATED APPLICATION

This patent application claims priority from Korean Patent Application No. 10-2004-0078279 filed on Oct. 1, 2004, the content of which is incorporated by reference herein in its entirety.

BACKGROUND OF THE INVENTION (a) Field of the Invention

The present invention relates to a display device and a driving method thereof.

(b) Description of Related Art

An active type display device such as an active matrix (AM) liquid crystal display (LCD) and an active matrix organic light emitting display (OLED) includes a plurality of pixels arranged in a matrix, switching elements, and a plurality of signal lines such as gate lines and data lines for transmitting signals to the switching elements. The switching elements of the pixels selectively transmit data signals from the data lines to the pixels in response to gate signals from the gate lines for displaying images. The pixels of the LCD adjust the transmittance of incident light depending on the data signals, while those of the OLED adjust the luminance level of the emitted light depending on the data signals.

The display device further includes a gate driver for generating and applying the gate signals to the gate lines and a data driver for applying the data signals to the data lines. Each of the gate driver and the data driver generally includes several driving integrated circuit (IC) chips. The number of the IC chips is preferably small to reduce manufacturing cost. In particular, the number of the data driving IC chips directly affects the manufacturing cost since the data driving IC chips are more expensive than the gate driving IC chips.

A method of manufacturing a display device that requires fewer IC chips would generally improve the cost-efficiency of display device manufacturing process.

SUMMARY OF THE INVENTION

In one aspect, the invention is a display device that includes a plurality of pixel rows arranged in a first direction, each of the pixel rows including pairs of first and second pixels adjacent to each other, each of the first pixels including a first switching element and each of the second pixels including a second switching element. A plurality of first gate lines are disposed above the pixel rows such that at least one of the first gate lines is disposed above each of the pixel rows, the first gate lines applying a first gate-on voltage to the first switching elements. A plurality of second gate lines are disposed below the pixel rows such that at least one of the second gate lines is disposed below each of the pixel rows, the second gate lines applying a second gate-on voltage to the second switching elements. A plurality of data lines intersect the first gate lines and the second gate lines, each data line disposed between the first and the second pixels in a pair of first and second pixels and applying data voltages to the first and the second pixels. A first gate driver applies the first gate-on voltage to the first gate lines, and a second gate driver applies the second gate-on voltage to the second gate lines. A data driver applies the data voltages to the data lines, wherein the second gate-on voltage is applied earlier than the first gate-on voltages by a predetermined time.

The predetermined time may be equal to about (½)H, wherein H is a period of a horizontal synchronization signal received by the display device.

The display device may further include a signal controller generating a plurality of control signals to control the first and the second gate drivers and the data driver, the control signals including a first scanning start signal and a first gate clock signal that are applied to the first gate driver and a second scanning start signal and a second gate clock signal that are applied to the second gate driver.

The signal controller may generate a pulse at the first scanning start signal and may generate a pulse at the second scanning start signal after a period of about (½) H elapses from the generation of the pulse at the first scanning start signal.

The duration of the first gate-on voltage and the second gate-on voltage may be equal to about 1 H.

The durations of the first gate-on voltage and the second gate-on voltage may overlap for about (½) H.

First and second pixels in each pixel row disposed between two adjacent data lines and forming a pixel set may be connected to a single data line.

Two pixels adjacent in a second direction may be connected to different data lines, wherein the second direction is substantially perpendicular to the first direction.

The first and the second switching elements in each pixel set may be disposed at different positions in different pixels, and the first switching elements and the second switching elements may be connected to different gate lines.

The first and the second switching elements in adjacent pixel pairs in a pixel row may occupy the same position.

The first and the second switching elements in adjacent pixel pairs arranged in the second direction occupy different positions.

The display device may further include red, green, and blue color filters overlapping the pixels and arranged in stripes.

In another aspect, the invention is a method of driving a display device. The display device includes a plurality of pixel rows including first and second pixels alternately arranged in a first direction, at least one first gate line disposed above each of the pixel rows and applying a first gate-on voltage to the first pixels, at least one second gate line disposed below each of the pixel rows and applying a second gate-on voltage to the second pixels, a plurality of data lines intersecting the first gate lines and the second gate lines, each data line disposed between the first and the second pixels in a pair of first and second pixels and applying data voltages to the first and the second pixels, a first gate driver applying the first gate-on voltage to the first gate lines, a second gate driver applying the second gate-on voltage to the second gate lines, and a data driver applying the data voltages to the data lines. The method includes: applying the second gate-on voltage to the second gate lines from the second gate driver; applying data voltages to the second pixels; applying the first gate-on voltage to the first gate lines from the first gate driver after a predetermined time elapses from the application of the second gate-on voltage; and applying data voltage to the first pixels.

In yet another aspect, the invention is a display device that includes: a plurality of pixels arranged in rows and columns, each pixel including a switching element and representing a color; a plurality of pairs of gate lines connected to the switching elements, the gate lines disposed below and above the pixel rows and transmitting a gate-on voltage for turning on the switching elements. A plurality of data lines are connected to the switching elements, disposed between two adjacent pixel columns and transmitting data voltages, wherein two adjacent pixels representing the same color in a single pixel row are pre-charged with data voltages for the pixels representing the same color and disposed in one or more pixel columns.

Two pixels in each pixel row disposed between two adjacent data lines may be connected to a single data line.

Two pixels adjacent in a column direction may be connected to different data lines.

Each pixel may further include one of red, green, and blue color filters and the color filters are arranged in stripes.

A driver inversion of the display device may be column inversion.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

Figure 1:
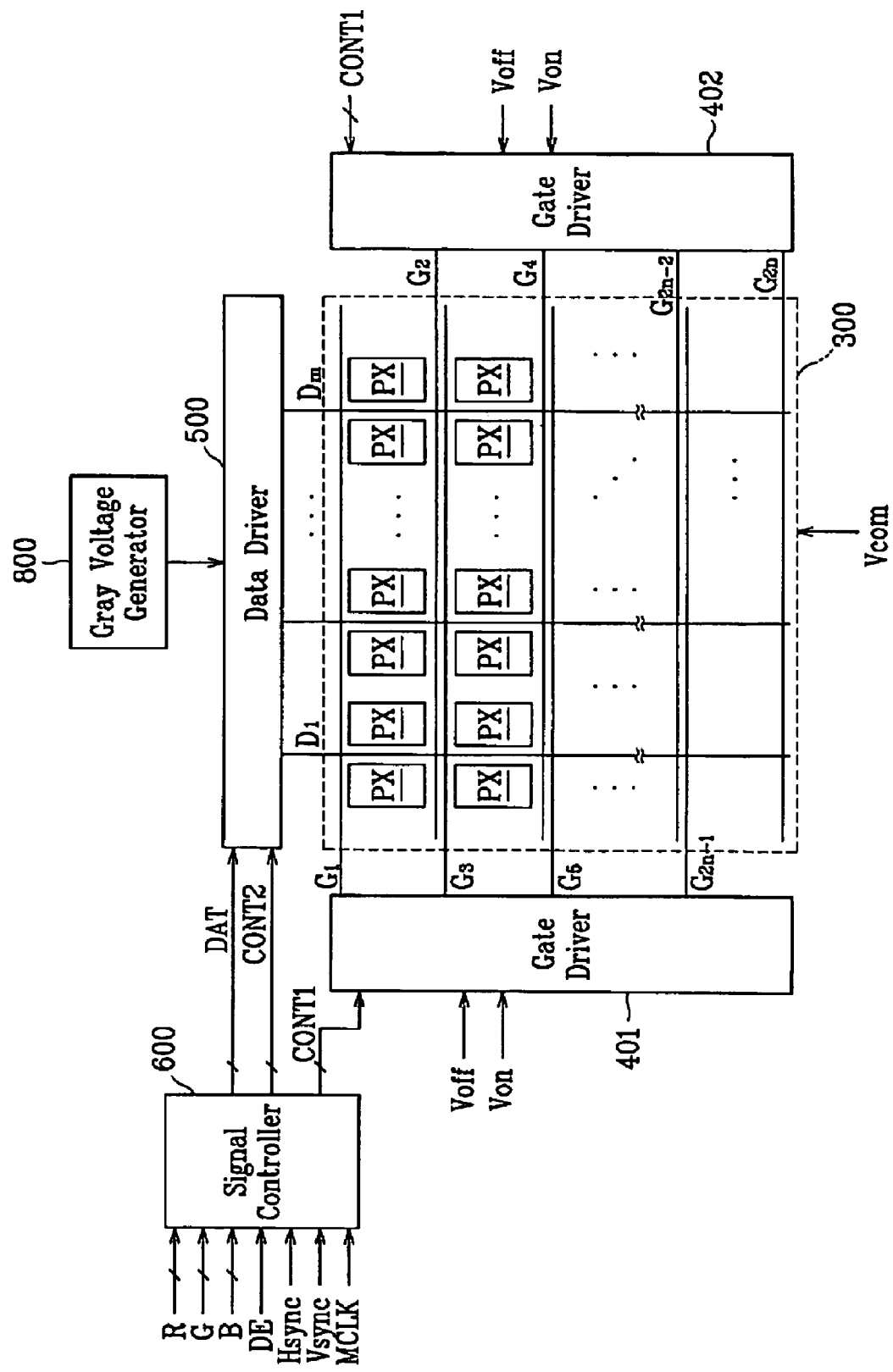
FIG. 1 is a block diagram of an LCD according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present.

Then, liquid crystal displays as an example of display device and driving methods thereof according to embodiments of the present invention will be described with reference to the accompanying drawings.

Figure 2:
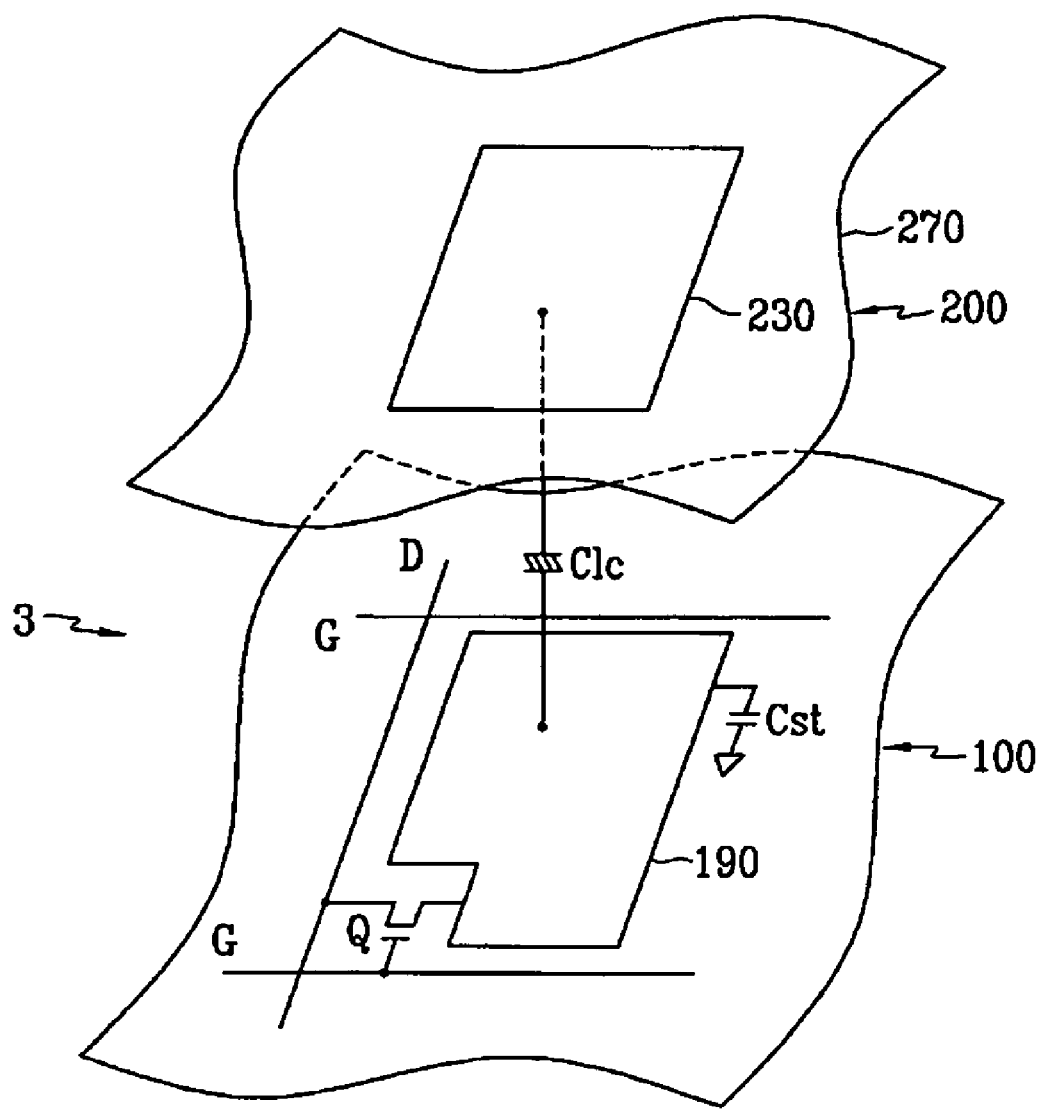
FIG. 2 is an equivalent circuit diagram of a pixel of an LCD according to an embodiment of the present invention.

FIG. 1 is a block diagram of an LCD according to an embodiment of the present invention, and FIG. 2 is an equivalent circuit diagram of a pixel of an LCD according to an embodiment of the present invention.

Referring to FIG. 1, an LCD according to an embodiment includes an LC panel assembly 300, a pair of gate drivers 401 and 402 and a data driver 500 that are connected to the panel assembly 300, a gray voltage generator 800 connected to the data driver 500, and a signal controller 600 controlling the above elements.

Referring to FIG. 1, the panel assembly 300 includes a plurality of display signal lines $G_1$-$G_{2n}$ and $D_1$-$D_m$ and a plurality of pixels PX connected thereto and arranged substantially in a matrix. In a structural view shown in FIG. 2, the panel assembly 300 includes lower and upper panels 100 and 200 and an LC layer 3 interposed therebetween.

The display signal lines $G_1$-$G_{2n}$ and $D_1$-$D_m$ are disposed on the lower panel 100 and include a plurality of gate lines $G_1$-$G_{2n}$ transmitting gate signals (also referred to as "scanning signals"), and a plurality of data lines $D_1$-$D_m$ transmitting data signals. The gate lines $G_1$-$G_{2n}$ extend substantially in a first direction and substantially parallel to each other, while the data lines $D_1$-$D_m$ extend substantially in a second direction and substantially parallel to each other. The first direction and the second direction are substantially perpendicular to each other.

Referring to FIG. 2, each pixel PX includes a switching element Q connected to a gate line G and a data line D, and a LC capacitor Clc and a storage capacitor Cst that are connected to the switching element Q. In other embodiments, the storage capacitor Cst may be omitted.

The switching element Q including a TFT is provided on the lower panel 100 and has three terminals: a control terminal connected to the gate line G; an input terminal connected to the data line D; and an output terminal connected to both the LC capacitor Clc and the storage capacitor Cst.

The LC capacitor Clc includes a pixel electrode 190 provided on the lower panel 100 and a common electrode 270 provided on an upper panel 200 as two terminals. The LC layer 3 disposed between the two electrodes 190 and 270 functions as dielectric of the LC capacitor Clc. The pixel electrode 190 is connected to the switching element Q, and the common electrode 270 is supplied with a common voltage Vcom and covers an entire surface of the upper panel 200. In other embodiments, the common electrode 270 may be provided on the lower panel 100, and at least one of the electrodes 190 and 270 may have a shape of a bar or a stripe.

The storage capacitor Cst is an auxiliary capacitor for the LC capacitor Clc. The storage capacitor Cst includes the pixel electrode 190 and a separate signal line, which is provided on the lower panel 100, overlapping the pixel electrode 190 via an insulator, and is supplied with a predetermined voltage such as the common voltage Vcom. Alternatively, the storage capacitor Cst includes the pixel electrode 190 and an adjacent gate line called a previous gate line, which overlaps the pixel electrode 190 via an insulator.

For color display, either each pixel PX uniquely represents one of the primary colors (i.e., spatial division), or every third pixel PX represents the same primary color and three consecutive pixels PX have different colors (i.e., temporal division). Thus, the spatial or temporal sum of the primary colors displays a desired color. FIG. 2 shows an example of spatial division in that each pixel PX includes a color filter 230 representing one of the primary colors in an area of the upper panel 200. Alternatively, the color filter 230 is provided on or under the pixel electrode 190 on the lower panel 100.

Typically, the primary colors include red, green, and blue. The pixels PX including red, green, and blue color filters are referred to as red, green, and blue pixels, respectively. A representative arrangement of red, green, and blue pixels is a stripe arrangement where each pixel row includes red, green, and blue pixels arranged in an alternating manner and each pixel column represents only one color.

One or more polarizers (not shown) are attached to at least one of the panels 100 and 200. In addition, one or more retardation films (not shown) for compensating refractive anisotropy may be disposed between the polarizer(s) and the panel(s).

Figure 3:
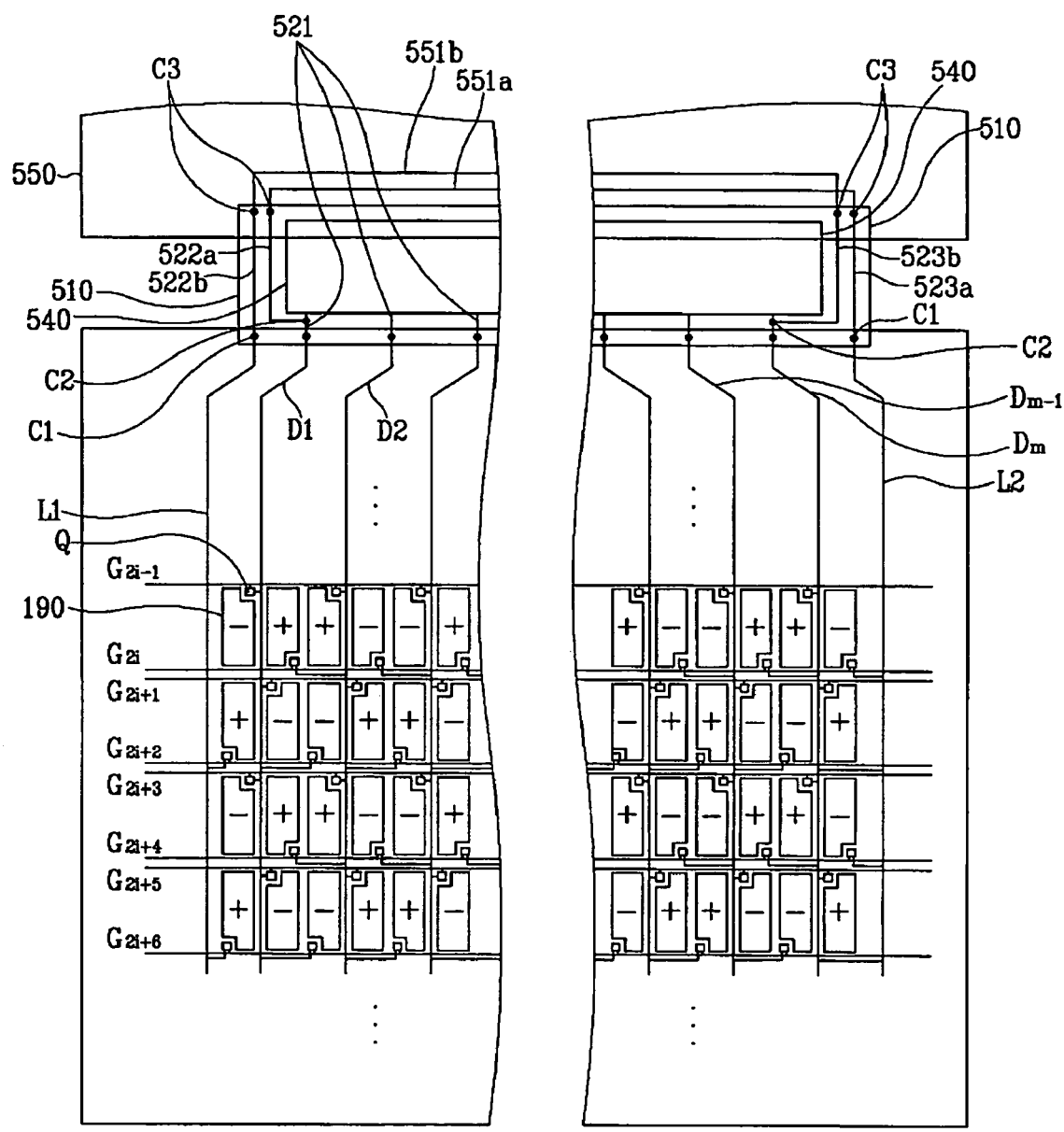
FIG. 3 schematically shows a structure of an LCD according to an embodiment of the present invention.

Referring to FIG. 3, a detailed configuration of an LCD according to an embodiment of the present invention is described.

FIG. 3 schematically shows a structure of an LCD according to an embodiment of the present invention.

Referring to FIG. 3, an LCD according to this embodiment includes a panel assembly 300, a printed circuit board (PCB) 550, and at least one flexible printed circuit (FPC) film 510 attached to the panel assembly 300 and the PCB 550.

The PCB 550 is disposed near an upper edge of the panel assembly 300 and mounts several circuit elements such as the signal controller 600, the gray voltage generator 800, etc. The FPC film 510 mounts a data driving IC 540 and includes a plurality of output lead lines 521 connected to output terminals of the data driving IC 540 and a plurality of input lead lines (not shown) connected to input terminals of the data driving IC 540.

The panel assembly 300 includes gate lines ($G_1, G_2, \ldots$), data lines ($D_1, D_2, \ldots$), and pixels and the pixels include pixel electrodes 190 and switching elements Q connected to the gate lines ($G_1, G_2, \ldots$), the data lines ($D_1, D_2, \ldots$), and the pixel electrodes 190. The data lines ($D_1, D_2, \ldots$) are connected to the lead lines 521 on the FPC film 510 through contact points C1.

The panel assembly 300 further includes left and right dummy lines L1 and L2 extending substantially parallel to the data lines ($D_1, D_2, \ldots$) and disposed to the left of the leftmost data line $D_1$ and to the right of the rightmost data line $D_m$, respectively. The PCB 550 further includes a pair of bypass lines 551a and 551b and the FPC film 510 further includes two pairs of connection lines 522a, 522b, 523a and 523b.

The right dummy line L2 is electrically connected to a lead line 521, which is connected to the leftmost data line $D_1$, through the connection line 523a, the bypass line 551a, and the connection line 522a. Likewise, the left dummy line L1 is electrically connected to another lead line 521, which is connected to the rightmost data line $D_m$, through the connection line 522b, the bypass line 551b, and the connection line 523b. The connection lines 522b and 523a are connected to the dummy lines L1 and L2 at contact points C1 and the connection lines 523b and 522a are connected to the lead lines 521 at contact points C2. The connection lines 522a, 522b, 523a and 523b are connected to the bypass lines 551a and 551b at contact points C3.

Each pair of gate lines $G_{2i-1}$ and $G_{2i}$ (i=1, 2, ...) are disposed at the upper and lower sides of a row of pixel electrodes 190. Each data line $D_j$ (j=1, 2, 3, ...) is disposed between two adjacent columns of the pixel electrodes 190. In other words, each data line $D_j$ (j=1, 2, 3, ...) is disposed between adjacent pairs of pixel electrodes 190. The left dummy line L1 is disposed to the left of the leftmost pixel column and the right dummy line L2 is disposed to the right of the rightmost pixel column.

The pixel electrodes 190 are connected to the gate lines ($G_1, G_2, \ldots$) and the data lines ($D_1, D_2, \ldots$) or the dummy lines L1 and L2 through the switching elements Q that are disposed near the corners of the pixel electrodes 190. (The connection between the pixel electrodes 190 and the dummy lines L1 and L2 will be omitted since the dummy lines L1 and L2 can be considered as the data lines ($D_1, D_2, \ldots$) in relation to the connection relation.) The corner positions of the pixel electrodes 190, which are assigned to the respective switching elements Q connected thereto, vary in rows and columns depending on the connection between the pixel electrode 190 and the gate lines ($G_1, G_2, \ldots$) and the data lines ($D_1, D_2, \ldots$). For example, a switching element Q for a pixel electrode 190 to be connected to an upper gate line $G_{2i-1}$ and a left data line ($D_1, D_2, \ldots$) is disposed near the upper left corner of the pixel electrode 190, which is the nearest corner from the upper gate line $G_{2i-1}$ and the left data line ($D_1, D_2, \ldots$).

A row of pixel electrodes 190 arranged in the horizontal direction with respect to FIG. 3 are alternately connected to a neighboring pair of gate lines $G_{2i-1}$ and $G_{2i}$ and alternately connected to the nearest data line and the next nearest data line. A column of pixel electrodes 190, which are arranged in the vertical direction with respect to FIG. 3, are alternately connected to upper gate lines $G_{2i-1}$ and lower gate lines $G_{2i}$ and alternately connected to the nearest data line and the next nearest data line.

Accordingly, a pair of pixel electrodes 190 disposed between two adjacent data lines and a pair of gate lines is connected to the same data line but to different gate lines.

The arrangement of the position of the switching elements in the pixel matrix and the connection to the respective gate lines and data lines can be described as follows. The pixels in each pixel row have switching elements positioned near an upper corner and a lower corner in an alternating manner. The pixels in each pixel column have switching elements positioned near an upper corner and a lower corner in an alternating manner and also positioned at a left corner and a right corner in an alternating manner. A pair of gate lines is disposed at the upper and lower sides of each pixel row where the switching elements of the pixels in each pixel row are connected to the gate line positioned nearest the respective switching element. Each data line is disposed between adjacent pairs of pixel columns and connected to switching elements associated with the pairs of pixels where one pixel of each pair has a switching element positioned nearest the respective data line. In one embodiment, each pair of pixels having switching elements connected to the same data line is disposed in the same pixel row. In another embodiment, two pixels in each pixel row disposed between two adjacent data lines have switching elements connected to the same data line. Finally, in yet another embodiment, two adjacent pixels in each pixel column have switching elements connected to different data lines.

This arrangement reduces the number of the data lines $D_1, D_2, D_3, \ldots$ to half of the pixel columns and the arrangement and the connections of the pixel electrodes 190 with the gate lines and the data lines shown in FIG. 3 may be varied.

Now, an LC panel assembly according to an embodiment of the present invention will be described in detail with reference to FIGS. 4, 5, 6 and 7.

Figure 4:
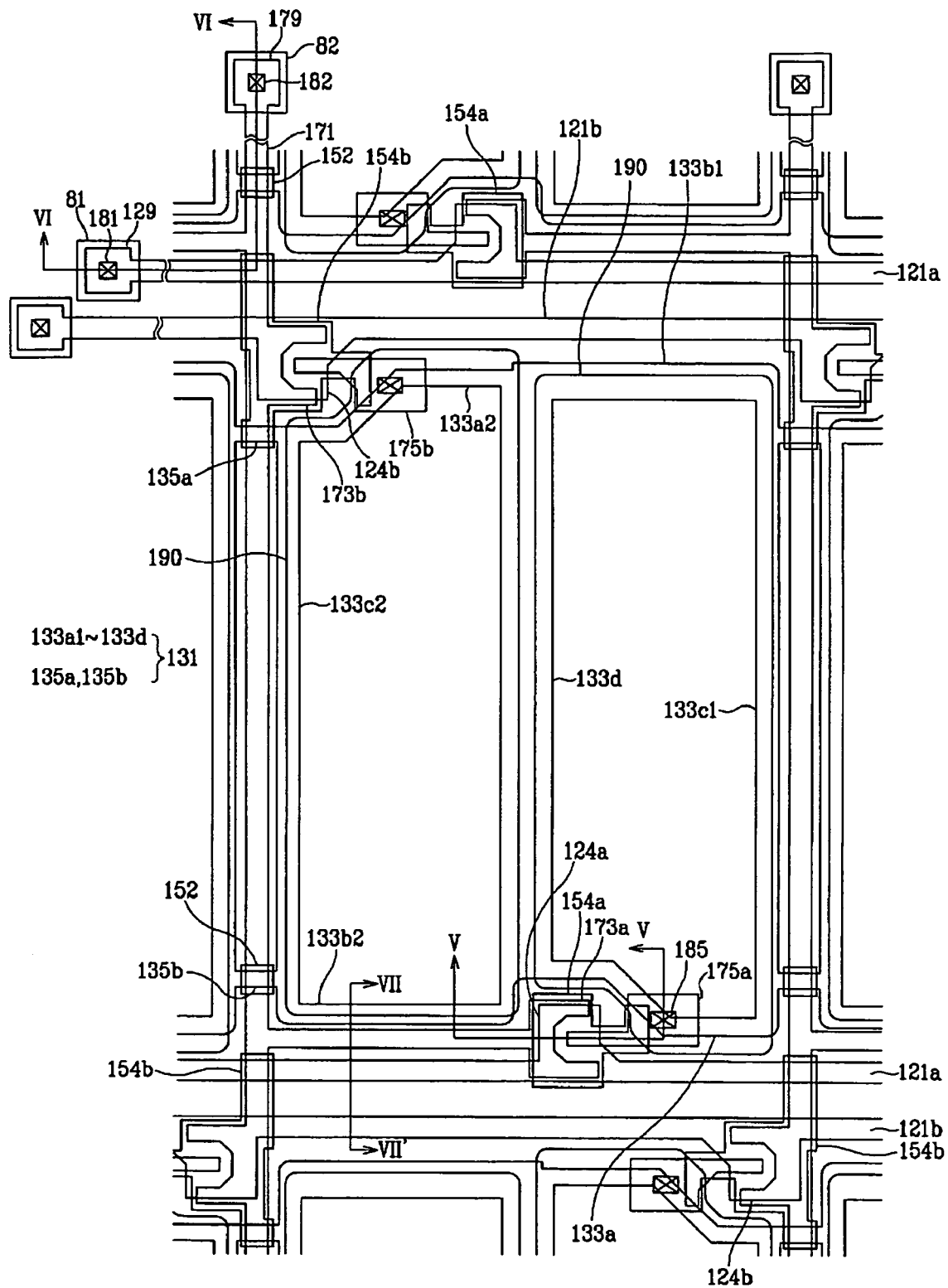
FIG. 4 is a layout view of a lower panel according to an embodiment of the present invention.
Figure 5:
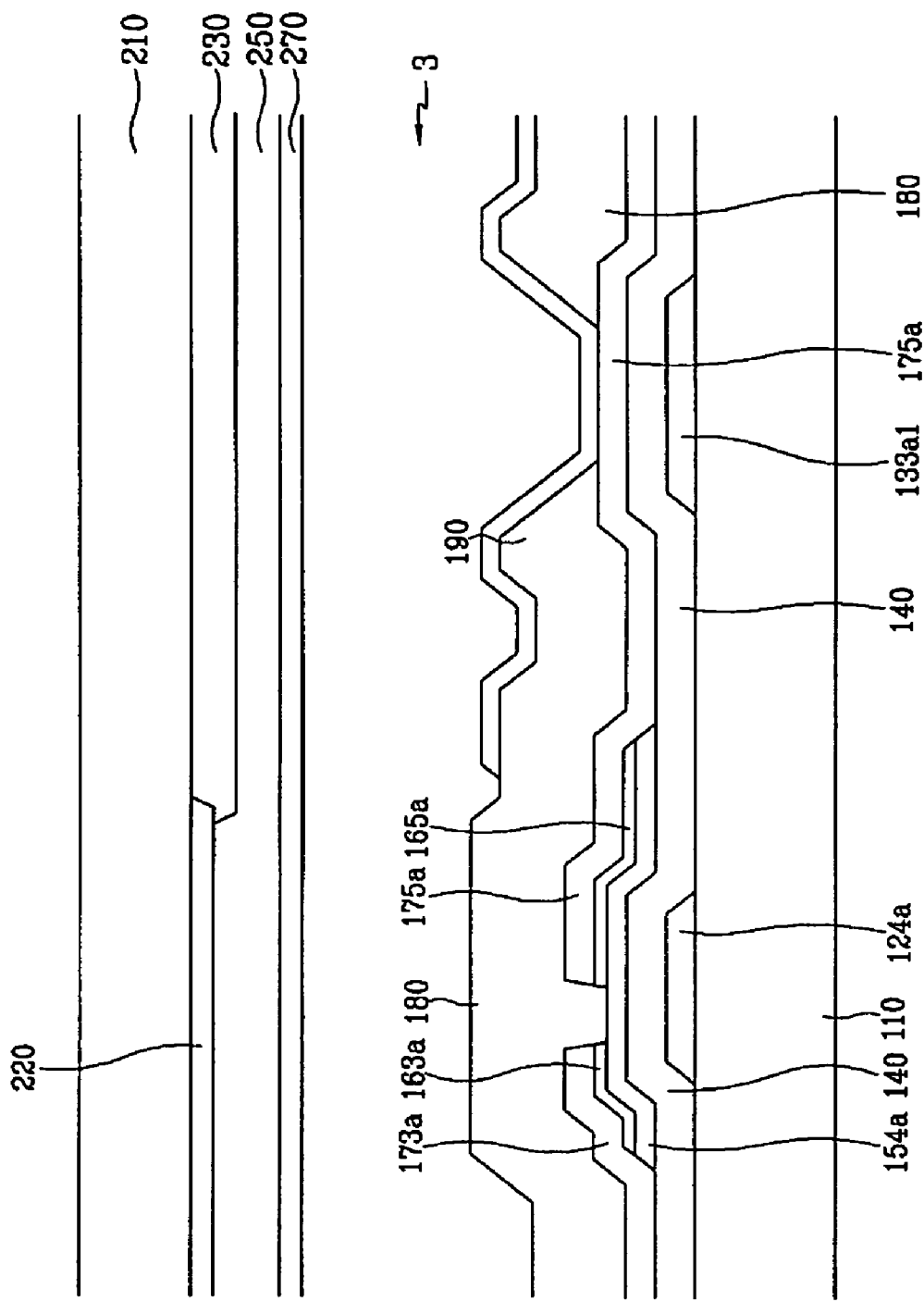
FIGS. 5, 6 and 7 are sectional views of the lower panel shown in FIG. 4 taken along lines V-V', VI-VI', and VII-VII', respectively.
Figure 6:
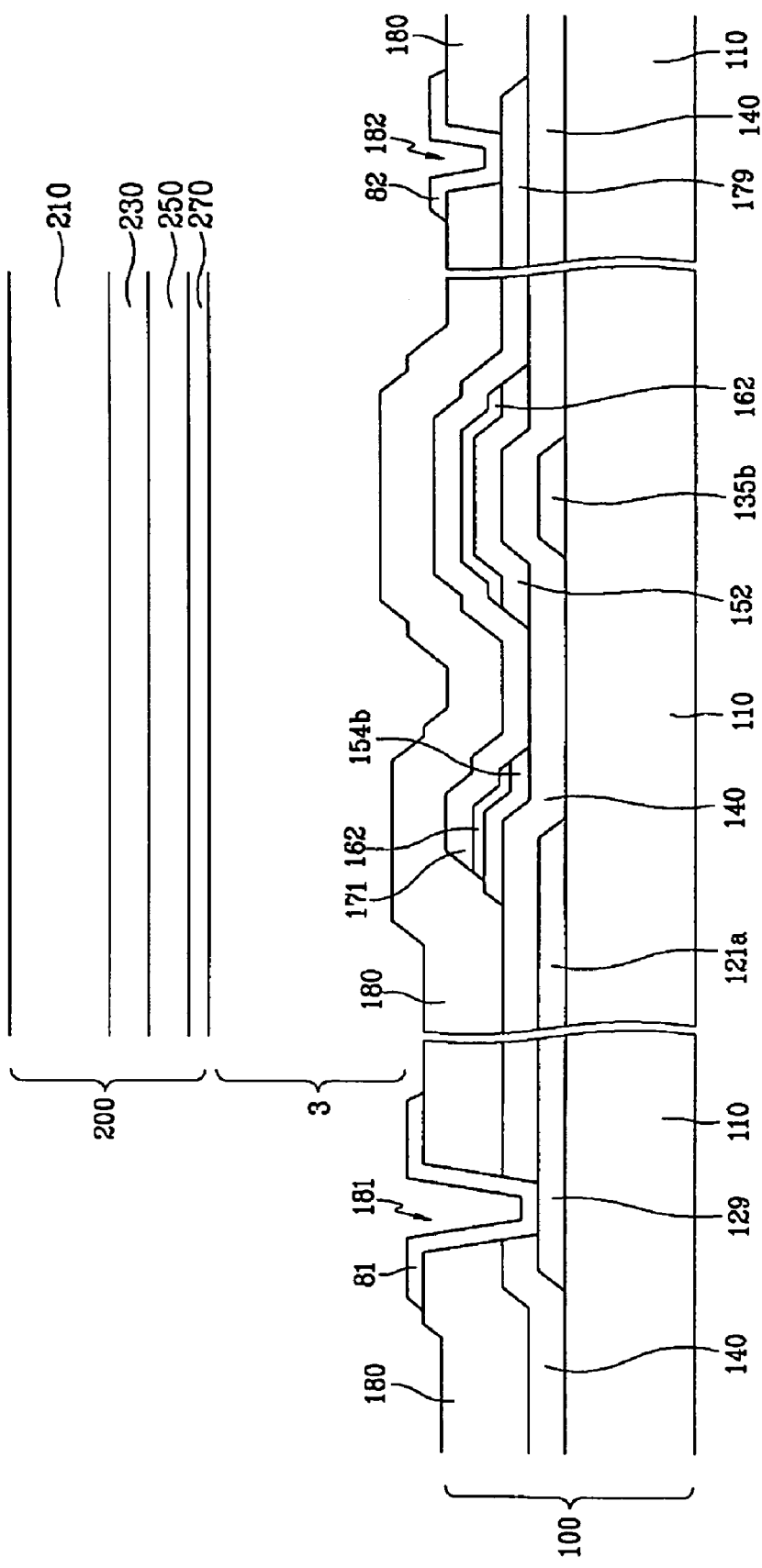
Figure 7:
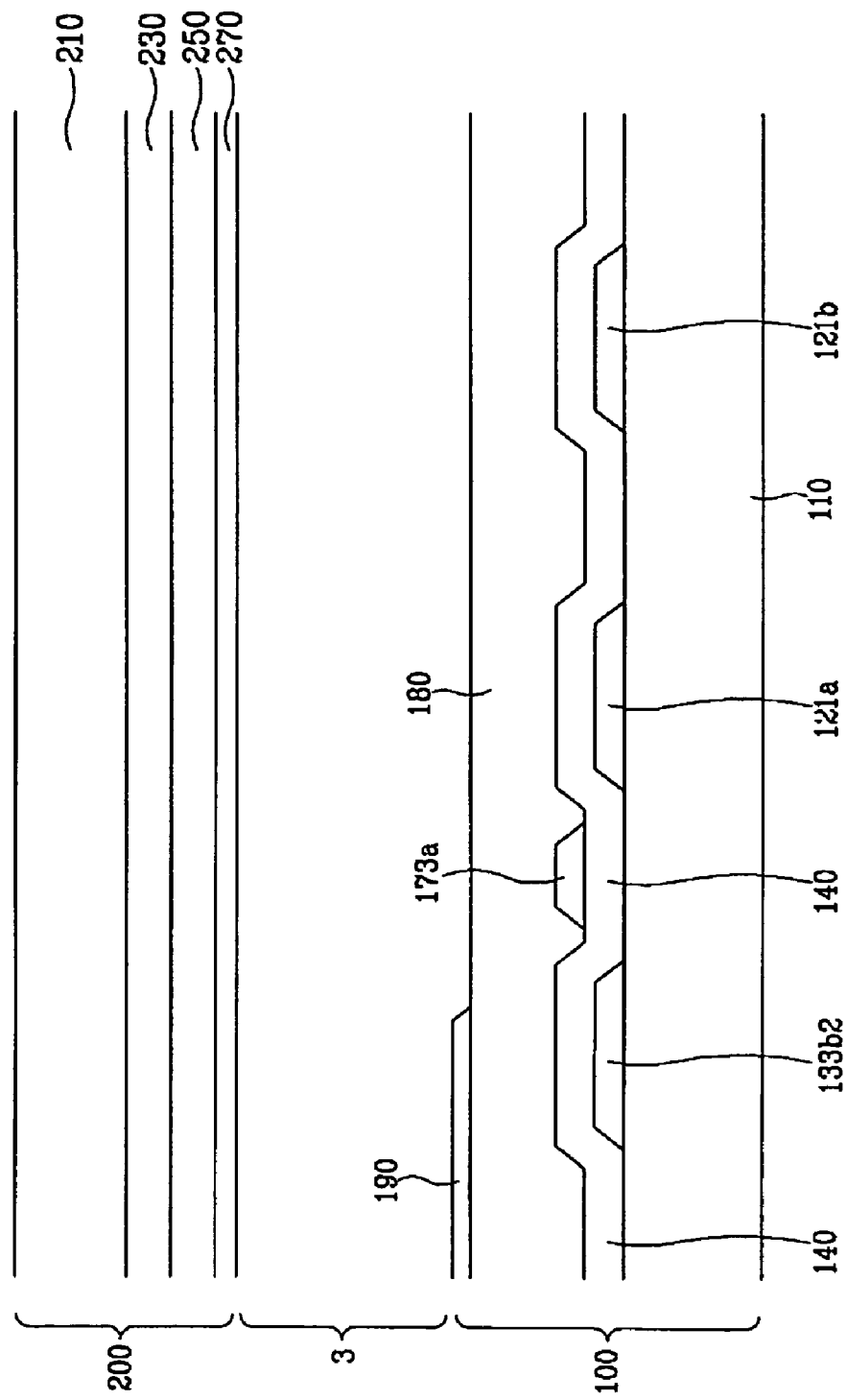

FIG. 4 is a layout view of a lower panel (TFT array panel) according to an embodiment of the present invention and FIGS. 5, 6 and 7 are sectional views of an LC panel assembly including the lower panel shown in FIG. 4 taken along lines V-V', VI-VI', and VII-VII', respectively.

Referring to FIGS. 4-7, an LC panel assembly according to an embodiment of the present invention includes a TFT array panel 100, a common electrode panel 200 facing the TFT array panel 100, and a liquid crystal layer 3 interposed between the panels 100 and 200.

First, the TFT array panel 100 will be described.

A plurality of pairs of gate lines 121a and 121b and a plurality of storage electrode lines 131 are formed on an insulating substrate 110 such as transparent glass or plastic.

The gate lines 121a and 121b transmit gate signals and extend substantially in a horizontal direction with respect to FIG. 4. The pair of gate lines 121a and 121b are separated from each other and include a plurality of gate electrodes 124a and 124b projecting toward each other, i.e., upward and downward. Each of the gate lines 121a and 121b further includes an end portion 129 having a large area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. The gate lines 121a and 121b may extend to be connected to a driving circuit that may be integrated on the substrate 110.

The storage electrode lines 131 are supplied with a predetermined voltage, and each of the storage electrode lines 131 is disposed between two adjacent gate lines 121. Each of the storage electrode lines 131 includes a plurality of sets of storage electrodes 133a, 133a1, 133a2, 133b1, 133b2, 133c1, 133c2 and 133d and a plurality of pairs of storage connections 135a and 135b connecting adjacent sets of storage electrodes 133a1-133d.

Each set of the storage electrodes 133a1-133d form nearly a pair of rectangles, each rectangle includes a first storage electrode 133a1 or 133a2 extending in the horizontal direction with respect to FIG. 4, a second storage electrode 133b1 or 133b2 extending in the same direction as the first storage electrode 133a1, 133a2 and disposed opposite the first storage electrode 133a1 or 133a2, a third storage electrode 133c1 or 133c2 extending in a vertical direction with respect to FIG. 4 and connecting one ends of the first and the second storage electrodes 133a1 and 133b1 or 133a2 and 133b2, and a fourth storage electrode 133d extending in the vertical direction with respect to FIG. 4 and connecting the other ends of the first and the second storage electrodes 133a1 and 133b1 or 133a2 and 133b2. The pair of rectangles commonly own the fourth storage electrode 133d and have a 180-degree rotational symmetry with respect to a center of the fourth storage electrode 133d. The first storage electrodes 133a1 and 133a2 are curved near the gate electrodes 124a and 124b. However, the storage electrode lines 131 may have different shapes and arrangements.

The gate lines 121a and 121b and the storage electrode lines 131 are preferably made of an Al-containing metal such as Al and Al alloy, a Ag-containing metal such as Ag and Ag alloy, a Cu-containing metal such as Cu and Cu alloy, a Mo-containing metal such as Mo and Mo alloy, Cr, Ta, or Ti. However, they may have a multi-layered structure including two conductive films (not shown) of different physical characteristics. One of the two films is preferably made of a low-resistivity metal such as an Al-containing metal, a Ag-containing metal, and a Cu-containing metal for reducing signal delay or voltage drop. The other film is preferably made of a material such as a Mo-containing metal, Cr, Ta, or Ti that has good physical, chemical, and electrical contact characteristics with other materials such as indium tin oxide (ITO) or indium zinc oxide (IZO). Examples of the combination of the two films are a lower Cr film and an upper Al (alloy) film and a lower Al (alloy) film and an upper Mo (alloy) film. However, the gate lines 121a and 121b and the storage electrode lines 131 may be made of metals or conductors other than what is mentioned above.

The lateral sides of the gate lines 121a and 121b and the storage electrode lines 131 are inclined relative to a surface of the substrate 110, as shown in FIG. 7. The inclination angle ranges between about 30-80 degrees with respect to the surface of the substrate 110.

A gate insulating layer 140 preferably made of silicon nitride (SiNx) or silicon oxide (SiOx) is formed on the gate lines 121a and 121b and the storage electrode lines 131.

A plurality of pairs of semiconductor islands 154a and 154b and a plurality of semiconductor islands 152 are formed on the gate insulating layer 140. Each of the semiconductor islands 154a and 154b is disposed on a gate electrode 124a or 124b and includes extensions covering the edges of the gate line 121a and 121b and a storage connection 135a. The semiconductor islands 152 are disposed on the storage connections 135b and cover the edges of the storage connections 135b. The semiconductor islands 152 and 154 are preferably made of hydrogenated amorphous silicon (abbreviated to "a-Si") or polysilicon.

A plurality of pairs of ohmic contact islands 163a and 165a are formed on the semiconductor island 154a, and a plurality of ohmic contact islands 162 are formed on the semiconductor island 152. In addition, a plurality of pairs of ohmic contact islands (not shown) are formed on the semiconductor islands 154b. The ohmic contacts 162, 163a and 165a are preferably made of n$^+$ hydrogenated a-Si heavily doped with an n-type impurity such as phosphorous or they may be made of silicide.

The lateral sides of the islands 152, 154a and 154b and the ohmic contacts 162, 163a and 165a are inclined relative to the surface of the substrate 110, preferably to form angles in a range of about 30-80 degrees relative to the substrate 110.

A plurality of data lines 171 and a plurality of drain electrodes 175a and 175b are formed on the ohmic contacts 162, 163a and 165a and the gate insulating layer 140.

The data lines 171 transmit data signals and extend substantially in the vertical direction with respect to FIG. 4 to intersect the gate lines 121a and 121b and the storage connections 135a and 135b. Each data line 171 includes a plurality of source electrodes 173a and 173b projecting toward the gate electrodes 124a and 124b and curved like a character J. Each of the source electrodes 173a extends in a space between adjacent two gate lines 121a and 121b.

Each of the data lines 171 further includes an end portion 179 having a large area for contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175a and 175b are separated from the data lines 171 and disposed opposite the source electrodes 173a and 173b with respect to the gate electrodes 124a and 124b. Each of the drain electrodes 175a and 175b includes a wide end portion and a narrow end portion. The wide end portion overlaps a storage electrode 133a and the narrow end portion is partly enclosed by a source electrode 173a or 173b.

A gate electrode 124a/124b, a source electrode 173a/173b, and a drain electrode 175a/175b along with a semiconductor island 154a/154b form a TFT having a channel formed in the semiconductor island 154a/154b disposed between the source electrode 173a/173b and the drain electrode 175a/175b.

The data lines 171 and the drain electrodes 175a and 175b are preferably made of a refractory metal such as Cr, Mo, Ta, Ti, or alloys thereof. However, they may have a multilayered structure including a refractory metal film (not shown) and a low resistivity film (not shown). Examples of the multi-layered structure are a double-layered structure including a lower Cr/Mo (alloy) film and an upper Al (alloy) film and a triple-layered structure of a lower Mo (alloy) film, an intermediate Al (alloy) film, and an upper Mo (alloy) film. However, the data lines 171 and the drain electrodes 175a and 175b may be made of any suitable metals or conductors not mentioned above.

The data lines 171 and the drain electrodes 175a and 175b have inclined edge profiles, as shown in FIGS. 5 and 6. The inclination angles range between about 30-80 degrees with respect to a surface of the substrate 110.

The ohmic contacts 162, 163a and 165a are interposed only between the underlying semiconductor islands 152, 154a and 154b and the overlying conductors 171, 175a and 175b thereon and reduce the contact resistance therebetween. The semiconductor islands 152 and the extensions of the semiconductor islands 154b disposed on the gate lines 121a and 121b and the storage connections 135a and 135b smooth the profile of the surface, thereby preventing the disconnection of the data lines 171. The semiconductor islands 152, 154a and 154b include some exposed portions, which are not covered by the data lines 171 and the drain electrodes 175a and 175b, such as portions located between the source electrodes 173a and 173b and the drain electrodes 175a and 175b (see FIG. 5).

A passivation layer 180 is formed on the data lines 171, the drain electrodes 175a and 175b, and the exposed portions of the semiconductor islands 152, 154a and 154b. The passivation layer 180 is preferably made of an inorganic or organic insulator and may have a flat top surface. Examples of the inorganic insulator include silicon nitride and silicon oxide. Where an organic insulator is used, the organic insulator may be photosensitive and have a dielectric constant less than about 4.0. The passivation layer 180 may include a lower film of inorganic insulator and an upper film of organic insulator such that it takes advantage of the excellent insulating characteristics of the organic insulator while preventing the exposed portions of the semiconductor islands 152, 154a and 154b from being damaged by the organic insulator.

The passivation layer 180 has a plurality of contact holes 182 and 185 exposing the end portions 179 of the data lines 171 and the drain electrodes 175a and 175b, respectively. In addition, the passivation layer 180 and the gate insulating layer 140 have a plurality of contact holes 181 exposing the end portions 129 of the gate lines 121a and 121b.

A plurality of pixel electrodes 190 and a plurality of contact assistants 81 and 82 are formed on the passivation layer 180. They are preferably made of a transparent conductor such as ITO or IZO or reflective conductor such as Ag, Al, Cr, or alloys thereof.

The pixel electrodes 190 are physically and electrically connected to the drain electrodes 175a and 175b through the contact holes 185 such that the pixel electrodes 190 receive data voltages from the drain electrodes 175a and 175b. The pixel electrodes 190 supplied with the data voltages generate electric fields in cooperation with a common electrode 270 of the common electrode panel 270 supplied with a common voltage, which determine the orientations of liquid crystal molecules (not shown) of the liquid crystal layer 3 disposed between the two electrodes 190 and 270. A pixel electrode 190 and the common electrode 270 form a LC capacitor Clc, which stores applied voltages after the TFT turns off.

A pixel electrode 190 overlaps the storage electrodes 133a1-133d. The pixel electrode 190 and a drain electrode 175a and 175b connected thereto and the storage electrode line 131 form a storage capacitor Cst, which enhances the voltage storing capacity of the LC capacitor Clc.

The pixel electrodes 190 cover the wide end portions of the drain electrodes 175a and 175b and have the longer edges disposed on the storage electrodes 133c1, 133c2 and 133d so that the storage electrodes 133c1, 133c2 and 133d block the interference between the pixel electrodes 190 and the data lines 171 and the interference between different pixel electrodes 190.

The contact assistants 81 and 82 are connected to the end portions 129 of the gate lines 121a and 121b and the end portions 179 of the data lines 171 through the contact holes 181 and 182, respectively. The contact assistants 81 and 82 protect the end portions 129 and 179 and enhance the adhesion between the end portions 129 and 179 and external devices.

The description of the common electrode panel 200 is as follows.

A light blocking member 220, which is commonly referred to as a black matrix for preventing light leakage, is formed on an insulating substrate 210 which may be transparent glass or plastic. The light blocking member 220 has a plurality of openings that face the pixel electrodes 190 and it may have substantially the same planar shape as the pixel electrodes 190. Otherwise, the light blocking member 220 may include a plurality of rectilinear portions facing the data lines 171 on the TFT array panel 100 and a plurality of widened portions facing the TFTs on the TFT array panel 100.

A plurality of color filters 230 are also formed on the substrate 210 and they are disposed substantially in the areas enclosed by the light blocking member 220. The color filters 230 may extend substantially in the same direction as the longest dimension of the pixel electrodes 190. The color filters 230 may represent one of the primary colors such as red, green and blue colors.

Optionally, an overcoat 250 is formed on the color filters 230 and the light blocking member 220. The overcoat 250 is preferably made of an (organic) insulator. The overcoat 250 prevents the color filters 230 from being exposed and provides a flat surface.

A common electrode 270 is formed on the overcoat 250. The common electrode 270 is preferably made of a transparent conductive material such as ITO and IZO.

Alignment layers (not shown) that may be homogeneous are formed on the inner surfaces of the panels 100 and 200.

Referring to FIG. 1 again, the gray voltage generator 800 generates two sets of a plurality of gray voltages related to the transmittance of the pixels. The gray voltages in one set have a positive polarity with respect to the common voltage Vcom, while those in the other set have a negative polarity with respect to the common voltage Vcom.

The gate drivers 401 and 402 are connected to odd gate lines ($G_1, G_2, \ldots, G_{2n-1}$) and even gate lines ($G_2, G_4, \ldots, G_{2n}$) of the panel assembly 300, respectively, and synthesize the gate-on voltage Von and the gate-off voltage Voff from an external device to generate gate signals for application to the gate lines $G_1$-$G_{2n}$.

The data driver 500 is connected to the data lines $D_1$-$D_m$ of the panel assembly 300 and applies data voltages, which are selected from the gray voltages supplied from the gray voltage generator 800, to the data lines $D_1$-$D_m$.

The drivers 401, 402 and 500 may include at least one integrated circuit (IC) chip mounted on the panel assembly 300 or on a flexible printed circuit (FPC) film in a tape carrier package (TCP) type, which are attached to the LC panel assembly 300. Alternatively, the drivers 401, 402 and 500 may be integrated into the panel assembly 300 along with the display signal lines $G_1$-$G_{2n}$ and $D_1$-$D_m$ and the TFT switching elements Q.

The signal controller 600 controls the gate drivers 401 and 402 and the data driver 500.

Now, the operation of the above-described LCD will be described in detail.

The signal controller 600 is supplied with input image signals R, G and B and input control signals controlling the display thereof such as a vertical synchronization signal Vsync, a horizontal synchronization signal Hsync, a main clock MCLK, and a data enable signal DE, from an external graphics controller (not shown). After generating the gate control signals CONT1 and data control signals CONT2 and processing the image signals R, G and B suitable for the operation of the panel assembly 300 on the basis of the input control signals and the input image signals R, G and B, the signal controller 600 transmits the gate control signals CONT1 to the gate drivers 401 and 402, and the processed image signals DAT and the data control signals CONT2 to the data driver 500. The processing of the image signals R, G and B includes the rearrangement of the image data R, G and B according to the pixel arrangement of the panel assembly 300 shown in FIG. 3.

Figure 8:
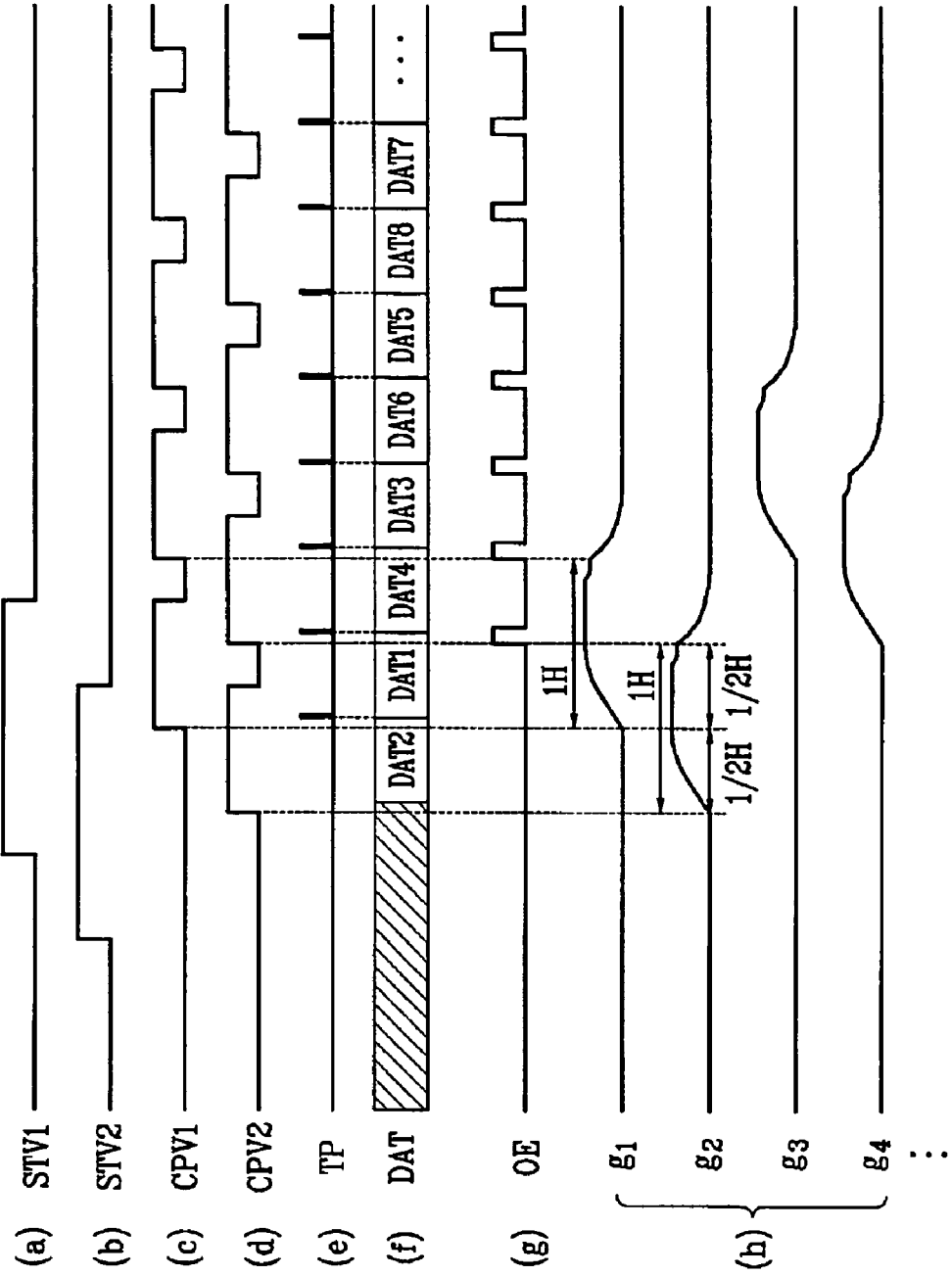
FIG. 8 schematically shows waveforms of signals for an LCD according to an embodiment of the present invention.

The gate control signals CONT1 include a pair of scanning start signals STV1 and STV2 for instructing to start scanning a pair of gate clock signals CPV1 and CPV2 for controlling the output time of the gate-on voltage Von, and an output enable signal OE for defining the duration of the gate-on voltage Von (See FIG. 8.) The scanning start signal STV1 and the gate clock signal CPV1 are outputted to the gate driver 401, and the scanning start signal STV2 and the gate clock signal CPV2 are outputted to the gate driver 402.

The data control signals CONT2 include a horizontal synchronization start signal STH for informing the start of data transmission for a group of pixels, a load signal TP for instructing to apply the data voltages to the data lines $D_1$-$D_m$, and a data clock signal HCLK. The data control signal CONT2 may further include an inversion signal RVS for reversing the polarity of the data voltages (with respect to the common voltage Vcom).

Responsive to the data control signals CONT2 from the signal controller 600, the data driver 500 receives a packet of the image data DAT for half of a row of pixels from the signal controller 600, converts the image data DAT into analog data voltages selected from the gray voltages supplied from the gray voltage generator 800, and applies the data voltages to the data lines $D_1$-$D_m$.

The gate drivers 401 and 402 apply the gate-on voltage Von to the odd gate line ($G_1, G_2, \ldots, G_{2n-1}$) and the even gate line ($G_2, G_4, \ldots, G_{2n}$) in response to the gate control signals CONT1 from the signal controller 600, thereby turning on the switching elements Q connected thereto. The data voltages applied to the data lines $D_1$-$D_m$ are supplied to the pixels through the activated switching elements Q.

The difference between the data voltage and the common voltage Vcom is represented as a voltage across the LC capacitor Clc, which is referred to as a pixel voltage. The LC molecules in the LC capacitor Clc have orientations depending on the magnitude of the pixel voltage, and the molecular orientations determine the polarization of light passing through the LC layer 3. The polarizer(s) converts the light polarization into the light transmittance.

By repeating this procedure by a unit of half of a horizontal period (which is denoted by "½ H" and is equal to half period of the horizontal synchronization signal Hsync or the data enable signal DE), all gate lines $G_1$-$G_{2n}$ are sequentially supplied with the gate-on voltage Von during a frame, and the data voltages are applied to all pixels. When the next frame starts after one frame finishes, the inversion control signal RVS applied to the data driver 500 is controlled such that the polarity of the data voltages is reversed (which is referred to as "frame inversion").

Other than the frame inversion, the data driver 500 varies the polarity of the data voltages flowing in each data line during one frame, thereby varying the polarity of the pixel voltages. Since the connections between the pixels and the data lines $D_1$-$D_m$ are as complex as shown in FIG. 3, the polarity inversion pattern generated by the data driver 500 is different from that of the pixel voltages appearing on the panel assembly 300. Hereinafter, the polarity inversion of the data driver 500 is referred to as "driver inversion" and the polarity inversion appearing on the panel assembly 300 is referred to as "apparent inversion."

The polarity inversion pattern shown in FIG. 3 is a driver inversion of a column inversion and an apparent inversion of 1×2 dot inversion. The driver column inversion means that the polarity of the data voltages in each data line is fixed and the polarities of the data voltages in adjacent data lines are opposite. The apparent 1×2 dot inversion means that the polarity is inverted every row and every two columns.

The above-described arrangements of the switching elements of the pixels realize a 1×2 dot-type apparent inversion for a given column-type driver inversion. The column-type driver inversion diversifies materials available for the data lines and thus it is easy to find a material suitable for simplifying the manufacturing process. In addition, the dot-type apparent inversion disperses the difference in the luminance due to the kickback voltages between the positive-polarity pixel voltages and the negative-polarity pixel voltages to thereby reduce vertical line defect.

Now, a scheme for applying data voltages to the pixels in an LCD according to an embodiment of the present invention is described with reference to FIGS. 8 and 9.

Figure 9:
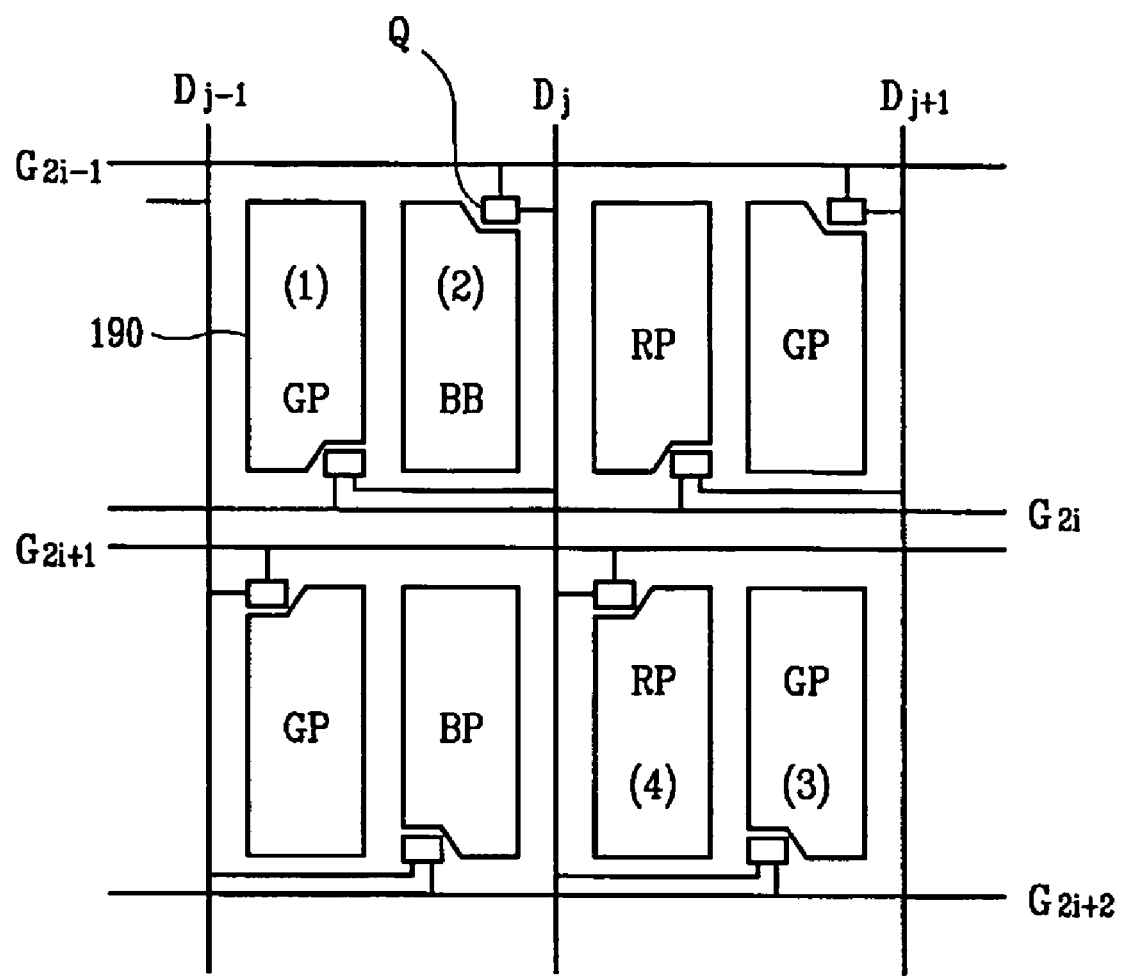
FIG. 9 illustrates the sequence of charging pixels in an LCD according to an embodiment of the present invention.

FIG. 8 schematically shows waveforms of signals for an LCD according to another embodiment of the present invention, and FIG. 9 illustrates a sequence of charging pixels in an LCD according to an embodiment of the present invention.

In FIG. 8, $g_1, g_2, g_3, g_4, \ldots$ denote gate signals applied to the first gate line $G_1$, the second gate line $G_2$, the third gate line $G_3$, the fourth gate line $G_4$, and so on.

Referring to FIG. 8, the duration for applying a gate-on voltage Von to each gate line $G_1$-$G_{2n}$ is equal to about 1 H, and the time for applying the gate-on voltage Von to two adjacent gate lines $G_1$-$G_{2n}$ overlap each other for about (½) H. At this time, a target data voltage for the pixels coupled to each gate line $G_1$-$G_{2n}$ is supplied for the latter (½) H.

As described above, the signal controller 600 provides the gate driver 401 with the scanning start signal STV1, the gate clock signal CPV1, etc., and provides the gate driver 402 with the scanning start signal STV2, the gate clock signal CPV2, etc.

The signal controller 600 generates a pulse at the scanning start signal STV2 applied to the gate driver 402, and generates another pulse at the gate clock signal CPV2 after a predetermined time as shown in (b) and (d) in FIG. 8.

The gate driver 402 generates a pulse at each gate signal ($g_2, g_4, \ldots$) in sequence in response to the pulse of the scanning start signal STV2. Each pulse of the gate signal ($g_2, g_4, \ldots$) has a magnitude equal to the gate-on voltage Von and continues from a rising of a pulse at the gate clock signal CPV2 to a rising of a next pulse at the gate clock signal CPV2. Therefore, the even gate lines ($G_2, G_4, G_6, \ldots$), i.e., the second gate line $G_2$, the fourth gate line $G_4$, the sixth gate line $G_6, \ldots$ are supplied with the gate-on voltage Von in sequence as shown in (h) of FIG. 8.

The pixels connected to the even gate lines ($G_2, G_4, G_6, \ldots$) are sequentially charged with data voltages corresponding to image data (DAT2, DAT4, DAT6, . . . ), which are supplied from the data driver 500, whenever the signal controller 600 generates a pulse at the load signal TP as shown in (e) of FIG. 8. For this purpose, the signal controller 600 stores a packet of image data for a row of the pixels into a line memory (not shown), and separately outputs the image data for the pixels connected to the odd gate lines ($G_1, G_3, \ldots$) and the image data for the pixels connected to the even gate lines ($G_2, G_4, \ldots$) to the data driver 500. Then, the data driver 500 supplies the data voltages for the pixels connected to the even gate lines ($G_2, G_4, G_6, \ldots$) through the switching elements Q for about (½) H.

After about (½) H elapses from the generation of a pulse at the scanning start signal STV2 for the gate driver 402, the signal controller 600 generates a pulse at the scanning start signal STV1 applied to the gate driver 401, generates another pulse at the gate clock signal CPV1 after a predetermined time as shown in (a) and (c) in FIG. 8.

Then, the gate driver 401 sequentially applies the gate-on voltage Von to the odd gate lines ($G_1, G_3, G_5, \ldots$), i.e., the first gate line ($G_1$), the third gate line $G_3$, the fifth gate line $G_5, \ldots$, based on the scanning start signal STV1 and the gate clock signal CPV1 as shown in (h) of FIG. 8.

The pixels connected to the odd gate lines ($G_1, G_3, G_5, \ldots$) are sequentially charged for about (½) H with data voltages corresponding to image data (DAT1, DAT3, DAT5, ...), which are supplied from the data driver 500, whenever the signal controller 600 generates a pulse at the load signal TP as shown in (e) of FIG. 8.

Since the time for the gate driver 402 to output the gate-on voltage Von and the time for the gate driver 401 to output the gate-on voltage Von are differentiated by about (½) H, the durations for two adjacent gate lines $G_1$-$G_{2n}$ to be supplied with the gate-on voltage Von overlap for about (½) H as described above. In detail, when the pixels connected to a gate line are charged with their own data voltages during the latter (½) H among 1 H given to the pixels, the pixels connected to a next gate line are pre-charged during the former (½) H of the 1 H given to them.

Accordingly, the gate-on voltage Von is applied to the gate lines in a sequence of $G_2$-$G_1$-$G_4$-$G_3$- . . . . Concerning the pixels (1), (2), (3) and (4) connected to a data line $D_j$ as shown in FIG. 9, the charging sequence is pixel (1)-pixel (2)-pixel (3)-pixel (4). It is noted that reference numerals RP, GP and BP denote red, green, and blue pixels, respectively.

This driving scheme can pre-charge the same-colored pixels in a pixel row with the data voltages for the other same-colored pixels, thereby reducing the difference in the luminance between the same-colored pixels. This will be described with reference to FIG. 10.

Figure 10:
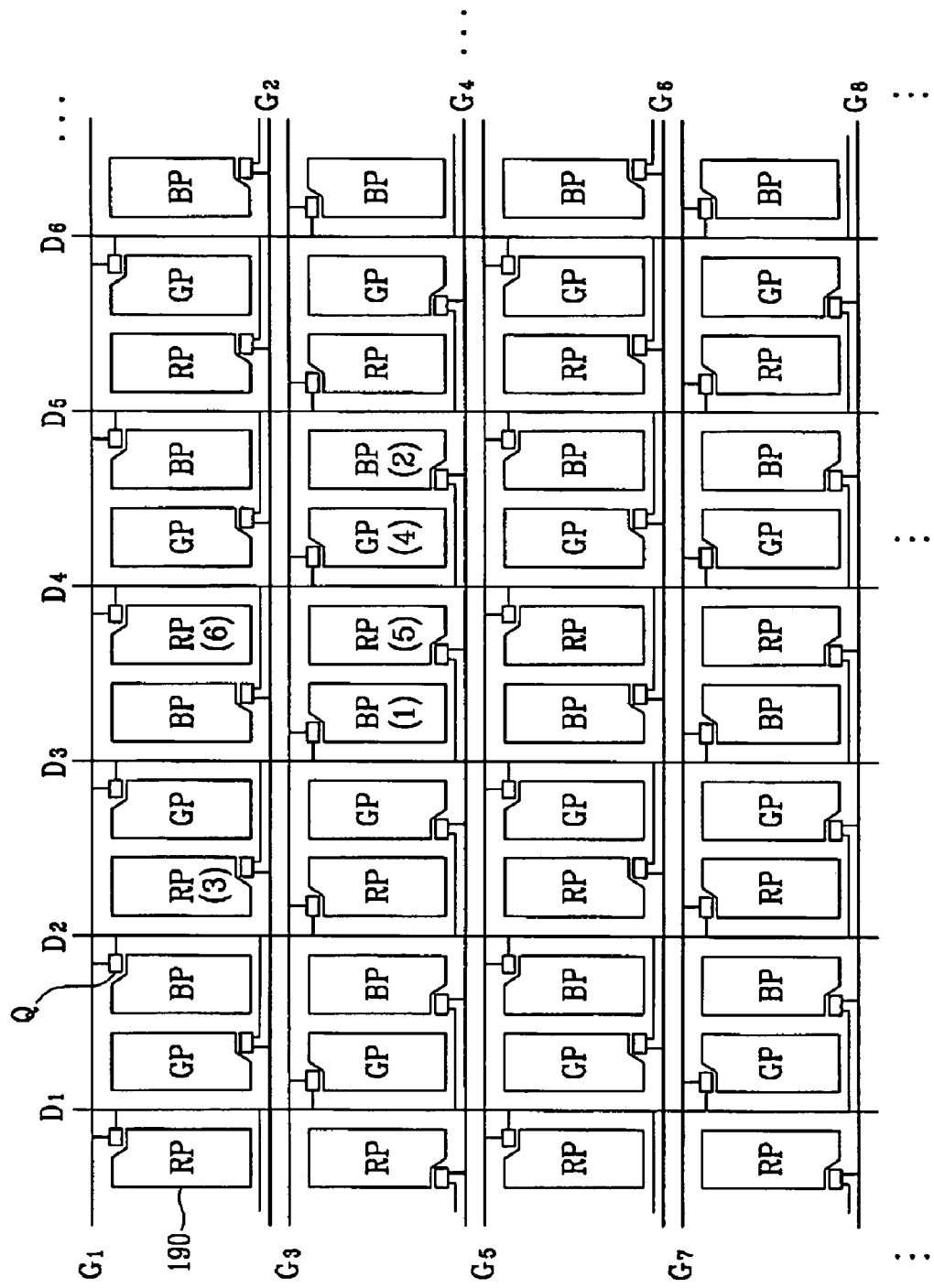
FIG. 10 illustrates an arrangement of the pixels when the red pixels RP represent black for displaying a cyan color.

FIG. 10 illustrates an arrangement of the pixels when the red pixels RP represent black for displaying a cyan color.

Referring to FIG. 10, the color filters (230 shown in FIG. 2) are arranged in stripes such that red, green, and blue pixels RP, GP and BP are sequentially arranged in each pixel row, and each pixel column includes the same-colored pixels. The red pixels RP are supplied a black data voltage for displaying a cyan color.

When the gate driver 401 for the odd gate lines ($G_1, G_3, G_5, \ldots$) is driven earlier than the gate driver 402 for the even gate lines ($G_2, G_4, G_6, \ldots$), the sequence of the application of the gate-on voltage Von to the gate lines $G_1$-$G_{2n}$ is G1-G2-G3-G4,.... Then, the pixels connected to the second gate line $G_2$ is subjected to the pre-charging during the primary charging of the pixels connected to the first gate line $G_1$. Likewise, the pixels connected to the third gate line $G_3$ is subjected to the preliminary charging during the primary charging of the pixels connected to the second gate line $G_2$. In this way, almost all the pixels experience the preliminary charging and the primary charging.

Let us consider pixels (1) and (2) shown in FIG. 10.

Since the data line $D_3$ connected to a blue pixel BP (1) that is connected to the third gate line $G_3$ is also connected to a red pixel RP (3) in a black state, and the RP(3) is connected to the second gate line $G_2$, the pre-charging voltage applied to the pixel (1) is a black data voltage. However, since the data line $D_4$, which is connected to another blue pixel BP (2) that is also connected to the third gate line $G_3$ is connected to a green pixel GP (4), and the green pixel GP(4) is connected to the second gate line $G_2$, the pre-charging voltage applied to the pixel (2) is a green data voltage.

Consequently, the blue pixels (1) and (2) in the pixel row are pre-charged with different data voltages, the black data voltage and the green data voltage, and thus the blue pixels (1) and (2) may have different resultant pixel voltages. This can be also applied to all the pixel rows to cause longitudinal stripes.

On the contrary, when the gate lines $G_1$-$G_{2n}$ are supplied with the gate-on voltage in a sequence of $G_2$-$G_1$-$G_4$-$G_3$, ..., the pixel (1) is pre-charged with a black data voltage for a red pixel RP (5) adjacent to the pixel (1). In addition, the pixel (2) is pre-charged with a black data voltage for a red pixel RP (6).

As a result, both the pixels (1) and (2) are pre-charged with a black data voltage such that the pixels (1) and (2) may have the same luminance when their own data voltages are equal.

In other words, a pixel including a switching element Q disposed below a pixel electrode 190 is pre-charged with a data voltage for another pixel that is disposed upper-left-left or upper-right-right to the pixel. In addition, a pixel including a switching element Q disposed above a pixel electrode 190 is pre-charged with a data voltage for another pixel disposed adjacent to the pixel.

Therefore, the same-colored pixels in a pixel row are pre-charged with data voltages for other pixels that represent the same color and disposed in the same pixel column or adjacent pixel columns. That is, the same-colored pixels are pre-charged with data voltages for the other same-colored pixels, thereby preventing the generation of longitudinal stripes.

In the meantime, the pixels connected to the second gate line $G_2$, which are charged first, may be pre-charged with predetermined voltages. For this purpose, the signal controller 600 may store image data for pre-charging the pixels into an internal memory (not shown).

The present invention can be also employed in other display devices such as OLED.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A display device comprising:
   a first pixel row and a second pixel row arranged in a first direction, the second pixel row disposed below the first pixel row, the first pixel row including a first group, the first group including a first pixel and a second pixel adjacent to each other, the first pixel including a first switching element, the second pixel including a second switching element, the second pixel row including a second group, the second group including a third pixel and a fourth pixel adjacent to each other;

a first gate line disposed above the first pixel row, the first gate line applying a first gate-on voltage to the first switching element;

a second gate line disposed below the first pixel row, the second gate line applying a second gate-on voltage to the second switching element;

a data line intersecting the first gate line and the second gate line, the data line disposed between the first group and the second group, the data line applying a data voltage to the first and the second pixels, the data line connected to the first pixel, the second pixel, the third pixel and the fourth pixel;

a gate driver applying the first gate-on voltage to the first gate line and applying the second gate-on voltage to the second gate line; and a data driver applying the data voltage to the data line.

2. The display device of claim 1, wherein the first pixel row includes a third group, the third group includes a fifth pixel and a six pixel adjacent to each other, the data line is disposed between the first group and the third group, and the fifth pixel and the sixth pixel are connected to a different data line.

3. The display device of claim 2, wherein the first and the second switching elements are disposed at different positions in the first and second pixels, and wherein the first switching element is connected to the first gate line and the second switching element is connected to the second gate lines.

4. The display device of claim 3, wherein the fifth pixel includes a fifth switching element and the sixth pixel includes a sixth switching element; and wherein the first and the second switching elements occupy the same position in the first and second pixels as the fifth and the sixth switching elements in the fifth and sixth pixels.

5. The display device of claim 3, wherein the third pixel includes a third switching element and the fourth pixel includes a fourth switching element; and a position of the third and the fourth switching elements in the third and fourth pixels is different from a position of the first and the second switching elements in the first and second pixels.

6. The display device of claim 1, further comprising red, green, and blue color filters overlapping the pixels and arranged in stripes.

7. The display device of claim 1, wherein the first pixel is disposed closer to the data line than the second pixel.

8. The display device of claim 7, wherein the first pixel is pre-charged by the overlapping of the first and second gate-on voltages.

9. The display device of claim 1, wherein the gate driver comprises a first gate driver applying the first gate-on voltage to the first gate line and a second gate driver applying the second gate-on voltage to the second gate line.

10. A method of driving a display device including a first pixel row and a second pixel row arranged in a first direction, the second pixel row disposed below the first pixel row, the first pixel row including a first group, the first group including a first pixel and a second pixel adjacent to each other, the second pixel row including a second group, the second group including a third pixel and a fourth pixel adjacent to each other; at least one first gate line disposed above the first pixel row and applying a first gate-on voltage to the first pixel, at least one second gate line disposed below the first pixel row and applying a second gate-on voltage to the second pixel, a data line intersecting the first gate line and the second gate line, the data line disposed between the first group and the second group, the date line connected to the first pixel, the second pixel, the third pixel and the fourth pixel, and the data line applying data voltage to the first and the second pixels, a gate driver applying the first gate-on voltage to the first gate line and applying the second gate-on voltage to the second gate line, and a data driver applying the data voltage to the data line, the method comprising:

applying the second gate-on voltage to the second gate line from the second gate driver;

applying data voltage to the second pixel;

applying the first gate-on voltage to the first gate line from the first gate driver after a predetermined time elapses from the application of the second gate-on voltage; and applying data voltage to the first pixel.

11. The method of claim 10, wherein the predetermined time is equal to about (½) H, wherein H is a period of a horizontal synchronization signal received by the display device.

12. The method of claim 11, wherein duration of the first gate-on voltage and the second gate-on voltage is equal to about 1H.

13. The method of claim 12, wherein the durations of the first gate-on voltage and the second gate-on voltage overlap for about (½) H.

14. The method of claim 11, further comprising a signal controller generating a plurality of control signals to control the first and the second gate drivers and the data driver, the control signals including a first scanning start signal and a first gate clock signal that are applied to the gate driver and a second scanning start signal and a second gate clock signal that are applied to the gate driver.

15. The method of claim 14, wherein the signal controller generates a pulse at the first scanning start signal and generates a pulse at the second scanning start signal after a period of about (½) H elapeses from the generation of the pulse at the first scanning start signal.

16. The method of claim 10, wherein the second gate-on voltage is overlapped with the first gate-on voltage.

17. The method of claim 16, wherein the first pixel is pre-charged by the overlapping of the first and second gate-on voltages, and wherein the first pixel is disposed closer to the data line than the second pixel.

18. The method of claim 10, wherein the gate driving comprises a first gate driver applying the first gate-on voltage to the first gate line and a second gate driver applying the second gate-on voltage to the second gate line.

* * * * *